US008574525B2

(12) United States Patent
Pimputkar et al.

(10) Patent No.: US 8,574,525 B2
(45) Date of Patent: Nov. 5, 2013

(54) USING BORON-CONTAINING COMPOUNDS, GASSES AND FLUIDS DURING AMMONOTHERMAL GROWTH OF GROUP-III NITRIDE CRYSTALS

(75) Inventors: Siddha Pimputkar, Goleta, CA (US); Derrick S. Kamber, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/128,092

(22) PCT Filed: Nov. 4, 2009

(86) PCT No.: PCT/US2009/063233
§ 371 (c)(1),
(2), (4) Date: May 6, 2011

(87) PCT Pub. No.: WO2010/053960
PCT Pub. Date: May 14, 2010

(65) Prior Publication Data
US 2011/0223092 A1    Sep. 15, 2011

Related U.S. Application Data

(60) Provisional application No. 61/112,550, filed on Nov. 7, 2008.

(51) Int. Cl.
| C01B 21/06 | (2006.01) |
| C01B 21/072 | (2006.01) |
| C01B 21/064 | (2006.01) |
| C30B 7/00 | (2006.01) |
| C30B 11/00 | (2006.01) |
| C30B 21/02 | (2006.01) |
| B01J 3/04 | (2006.01) |
| B01D 9/00 | (2006.01) |
| H01B 1/06 | (2006.01) |
| C09K 5/00 | (2006.01) |

(52) U.S. Cl.
USPC ............ 423/290; 423/412; 423/409; 117/68; 117/206; 117/71; 117/224; 422/245.1; 252/519.14; 252/76

(58) Field of Classification Search
None
See application file for complete search history.

(56) References Cited

U.S. PATENT DOCUMENTS 3,647,389 A * 3/1972 Weiner ........................... 117/17
5,131,975 A * 7/1992 Bourret-Courchesne ....... 117/82
(Continued)

FOREIGN PATENT DOCUMENTS

| CN | 101736400 A | * | 6/2010 |
| JP | 2007012705 A | * | 1/2007 |

OTHER PUBLICATIONS

PCT International Search Report and Written Opinion dated Dec. 30, 2009 (PCT International Application No. PCT/US2009-063233).

(Continued)

*Primary Examiner* — Guinever Gregorio
(74) *Attorney, Agent, or Firm* — Gates & Cooper LLP

(57) ABSTRACT

Boron-containing compounds, gasses and fluids are used during ammonothermal growth of group-Ill nitride crystals. Boron-containing compounds are used as impurity getters during the ammonothermal growth of group-Ill nitride crystals. In addition, a boron-containing gas and/or supercritical fluid is used for enhanced solubility of group-Ill nitride into said fluid.

5 Claims, 2 Drawing Sheets

(56) References Cited

U.S. PATENT DOCUMENTS

| | | |
|---|---|---|
| 6,398,867 B1 | 6/2002 | D'Evelyn et al. |
| 7,078,731 B2 | 7/2006 | D'Evelyn et al. |
| 7,364,619 B2 | 4/2008 | Dwilinski et al. |
| 2007/0234946 A1* | 10/2007 | Hashimoto et al. .............. 117/71 |
| 2010/0068118 A1* | 3/2010 | Hashimoto et al. ........... 423/409 |
| 2010/0151194 A1* | 6/2010 | D'Evelyn ..................... 428/141 |
| 2011/0274609 A1* | 11/2011 | Shimodaira et al. .......... 423/409 |
| 2011/0300051 A1* | 12/2011 | Kamber et al. ............... 423/409 |

OTHER PUBLICATIONS

Zheng, et al., "One-Step One-Phase Synthesis of Monodisperse Noble-Metallic Nanoparticles and Their Colloidal Crystals", J. Am. Chem. Soc. Jan. 27, 2006, 128, 6550-6551.

* cited by examiner

USING BORON-CONTAINING COMPOUNDS, GASSES AND FLUIDS DURING AMMONOTHERMAL GROWTH OF GROUP-III NITRIDE CRYSTALS

CROSS REFERENCE TO RELATED APPLICATIONS

This application is a national application that claims the benefit under 35 U.S.C. Section 365(c) of co-pending and commonly-assigned application:

P.C.T. International Patent Application Serial No. PCT/US2009/063233, filed on Nov. 4, 2009, by Siddha Pimputkar, Derrick S. Kamber, James S. Speck and Shuji Nakamura, entitled "USING BORON-CONTAINING COMPOUNDS, GASSES AND FLUIDS DURING AMMONOTHERMAL GROWTH OF GROUP-III NITRIDE CRYSTALS;"

which application claims the benefit under 35 U.S.C. Section 119(e) of co-pending and commonly-assigned application:

U.S. Provisional Application Ser. No. 61/112,550, filed on Nov. 7, 2008, by Siddha Pimputkar, Derrick S. Kamber, James S. Speck and Shuji Nakamura, entitled "USING BORON-CONTAINING COMPOUNDS, GASSES AND FLUIDS DURING AMMONOTHERMAL GROWTH OF GROUP-III NITRIDE CRYSTALS,";

both of which applications are incorporated by reference herein.

This application is related to the following co-pending and commonly-assigned U.S. patent applications:

U.S. Utility patent application Ser. No. 11/921,396, filed on Nov. 30, 2007, by Kenji Fujito, Tadao Hashimoto and Shuji Nakamura, entitled "METHOD FOR GROWING GROUP-III NITRIDE CRYSTALS IN SUPERCRITICAL AMMONIA USING AN AUTOCLAVE," which application claims the benefit under 35 U.S.C. Section 365(c) of PCT Utility Patent Application Ser. No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,"

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,"

U.S. Utility patent application Ser. No. 11/765,629, filed on Jun. 20, 2007, by Tadao Hashimoto, Hitoshi Sato and Shuji Nakamura, entitled "OPTO- ELECTRONIC AND ELECTRONIC DEVICES USING N-FACE OR M-PLANE GaN SUBSTRATE PREPARED WITH AMMONOTHERMAL GROWTH,", now U.S. Pat. No. 7,755,172, issued on Jul. 13, 2010, which application claims the benefit under 35 U.S.C. Section 1 19(e) of U.S. Provisional Application Ser. No. 60/815,507, filed on Jun. 21, 2006, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH,";

U.S. Utility patent Ser. No. 12/234,244, filed on Sep. 19, 2008, by Tadao Hashimoto and Shuji Nakamura, entitled "GALLIUM NITRIDE BULK CRYSTALS AND THEIR GROWTH METHOD,", now U.S. Pat. No. 8,253,221, issued on Aug. 28, 2012, which application claims the benefit under 35 U.S.C. Section 119(e) of U.S. Provisional Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,", now U.S. Pat. No. 7,803,344, issued on Sep. 28, 2010, which application claims the benefit under 35 U.S.C. Section 119(e) of U.S. Provisional Application Ser. No. 60/854,567, filed on Oct. 25, 2006, by Tadao Hashimoto, entitled "METHOD FOR GROWING GROUP-III NITRIDE CRYSTALS IN MIXTURE OF SUPERCRITICAL AMMONIA AND NITROGEN AND GROUP-III NITRIDE CRYSTALS,";

U.S. Utility patent application Ser. No. 12/612,477, filed on Nov. 4, 2009, by Siddha Pimputkar, Demck S. Kamber, Makoto Saito, Steven P. DenBaars, James S. Speck and Shuji Nakamura, entitled "GROUP-III NITRIDE MONOCRYSTAL WITH IMPROVED CRYSTAL QUALITY GROW ON AN ETCHED-BACK SEED CRYSTALS AND METHOD OF PRODUCING THE SAME,", which application claims the benefit under 35 U.S.C. Section 119(e) of U.S. Provisional Application Ser. No. 61/111,644, filed on Nov. 5, 2008, by Siddha Pimputkar, Derrick S. Kamber, Makoto Saito, Steven P. DenBaars, James S. Speck and Shuji Nakamura, entitled "GROUP-III NITRIDE MONOCRYSTAL WITH IMPROVED CRYSTAL QUALITY GROWN ON AN ETCHED-BACK SEED CRYSTALS AND METHOD OF PRODUCING THE SAME,";

P.C.T. International Patent Application Ser. No. PCT/US09/063240, filed on Nov. 4, 2009, by Derrick S. Kamber, Siddha Pimputkar, Makoto Saito, Steven P. DenBaars, James S. Speck and Shuji Nakamura, entitled "GROUP-III NITRIDE MONOCRYSTAL WITH IMPROVED PURITY AND METHOD OF PRODUCING THE SAME,", which application claims the benefit under 35 U.S.C. Section 119(e) of U.S. Provisional Application Ser. No. 61/112,555, filed on Nov. 7, 2008, by Derrick S. Kamber, Siddha Pimputkar, Makoto Saito, Steven P. DenBaars, James S. Speck and Shuji Nakamura, entitled "GROUP-III NITRIDE MONOCRYSTAL WITH IMPROVED PURITY AND METHOD OF PRODUCING THE SAME,";

P.C.T. International Patent Application Ser. No. PCT/US09/063239, filed on Nov. 4, 2009, by Siddha Pimputkar, Derrick S. Kamber, James S. Speck and Shuji Nakamura, entitled "REACTOR DESIGNS FOR USE IN AMMONOTHERMAL GROWTH OF GROUP-III NITRIDE CRYSTALS,", which application claims the benefit under 35 U.S.C. Section 119(e) of U.S. Provisional Application Ser. No. 61/112,560, filed on Nov. 7, 2008, by Siddha Pimputkar, Derrick S. Kamber, James S. Speck and Shuji Nakamura, entitled "REACTOR DESIGNS FOR USE IN AMMONOTHERMAL GROWTH OF GROUP-III NITRIDE CRYSTALS,";

P.C.T. International Patent Application Ser. No. PCT/US09/063238, filed on Nov. 4, 2009, by Siddha Pimputkar, Derrick S. Kamber, James S. Speck and Shuji Nakamura, entitled "NOVEL VESSEL DESIGNS AND RELATIVE PLACEMENTS OF THE SOURCE MATERIAL AND SEED CRYSTALS WITH RESPECT TO THE VESSEL FOR THE AMMONOTHERMAL GROWTH OF GROUP-III NITRIDE CRYSTALS,", which application claims the benefit under 35 U.S.C. Section 119(e) of U.S. Provisional Application Ser. No. 61/112,552, filed on Nov. 7, 2008, by Siddha Pimputkar, Derrick S. Kamber, James S. Speck and Shuji Nakamura, entitled "NOVEL VESSEL DESIGNS AND RELATIVE PLACEMENTS OF THE SOURCE MATERIAL AND SEED CRYSTALS WITH RESPECT TO THE VESSEL FOR THE AMMONOTHERMAL GROWTH OF GROUP-III NITRIDE CRYSTALS,";

P.C.T. International Patent Application Ser. No, PCT/US09/063287, filed on Nov. 4, 2009, by Siddha Pimputkar, Derrick S. Kamber, James S. Speck and Shuji Nakamura, entitled "ADDITION OF HYDROGEN AND/OR NITROGEN CONTAINING COMPOUNDS TO THE NITROGEN-CONTAINING SOLVENT USED DURING THE AMMONOTHERMAL GROWTH OF GROUP-III NITRIDE CRYSTALS,", which application claims the benefit under 35 U.S.C. Section 119(e) of U.S. Provisional Application Ser. No. 61/112,558, filed on Nov. 7, 2008, by Siddha Pimputkar, Derrick S. Kamber, James S. Speck and Shuji Nakamura, entitled "ADDITION OF HYDROGEN AND/OR NITROGEN CONTAINING COMPOUNDS TO THE NITROGEN-CONTAINING SOLVENT USED DURING THE AMMONOTHERMAL GROWTH OF GROUP-III NITRIDE CRYSTALS TO OFFSET THE DECOMPOSITION OF THE NITROGEN-CONTAINING SOLVENT AND/OR MASS LOSS DUE TO DIFFUSION OF HYDROGEN OUT OF THE CLOSED VESSEL,"; and P.C.T. International Patent Application Ser. No. PCT/US09/063236, filed on Nov. 4, 2009, by Siddha Pimputkar, Derrick S. Kamber, James S. Speck and Shuji Nakamura, entitled "CONTROLLING RELATIVE GROWTH RATES OF DIFERENT EXPOSED CRYSTALLOGRAPHIC FACETS OF A GROUP-III NITRIDE CRYSTAL DURING THE AMMONOTHERMAL GROWTH OF A GROUP-III NITRIDE CRYSTAL,", which application claims the benefit under 35 U.S.C. Section 119(e) of U.S. Provisional Application Ser. No. 61/112,545, filed on Nov. 7, 2008, by Siddha Pimputkar, Derrick S. Kamber, James S. Speck and Shuji Nakamura, entitled "CONTROLLING RELATIVE GROWTH RATES OF DIFERENT EXPOSED CRYSTALLOGRAPHIC FACETS OF A CROUP-III NITRIDE CRYSTAL DURING THE AMMONOTHERMAL GROWTH OF A GROUP-III NITRIDE CRYSTAL,";

all of which applications are incorporated by reference herein.

BACKGROUND OF THE INVENTION

1. Field of the Invention

This invention relates to ammonothermal growth of group-III nitrides.

2. Description of the Related Art

Ammonothermal growth of group-III nitrides, for example, GaN, involves placing, within a reactor vessel, group-III containing source materials, group-III nitride seed crystals, and a nitrogen-containing solvent, such as ammonia, sealing the vessel and heating the vessel to conditions such that the vessel is at elevated temperatures (between 23° C. and 1000° C.) and high pressures (between 1 atm and, for example, 30,000 atm). Under these temperatures and pressures, the nitrogen-containing solvent may become a supercritical fluid which normally exhibits enhanced solubility of the group-III containing materials into solution. The solubility of the group-III containing materials into the nitrogen-containing solvent is dependent on the temperature, pressure and density of the solvent, among other things. By creating two different zones within the vessel, it is possible to establish a solubility gradient where, in one zone, the solubility will be higher than in a second zone. The group-III containing source materials are then preferentially placed in the higher solubility zone and the seed crystals in the lower solubility zone. By establishing fluid motion of the solvent with the dissolved source materials between these two zones, for example, by making use of natural convection, it is possible to transport the fluid from the higher solubility zone to the lower solubility zone where the group-III nitride crystals are grown on the seed crystals.

What is need in the art are improved techniques for ammonothermal growth of group-III nitrides. The present invention satisfies this need.

SUMMARY OF THE INVENTION

To overcome the limitations in the prior art described above, and to overcome other limitations that will become apparent upon reading and understanding the present invention, the present invention discloses the use of boron-containing compounds, gasses and fluids during ammonothermal growth of group-III nitride crystals. The boron-containing compounds are used as impurity getters during the ammonothermal growth of group-III nitride crystals. In addition, a boron-containing gas and/or supercritical fluid is used for enhanced solubility of source materials into the fluid.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Apparatus Description

Figure 1:
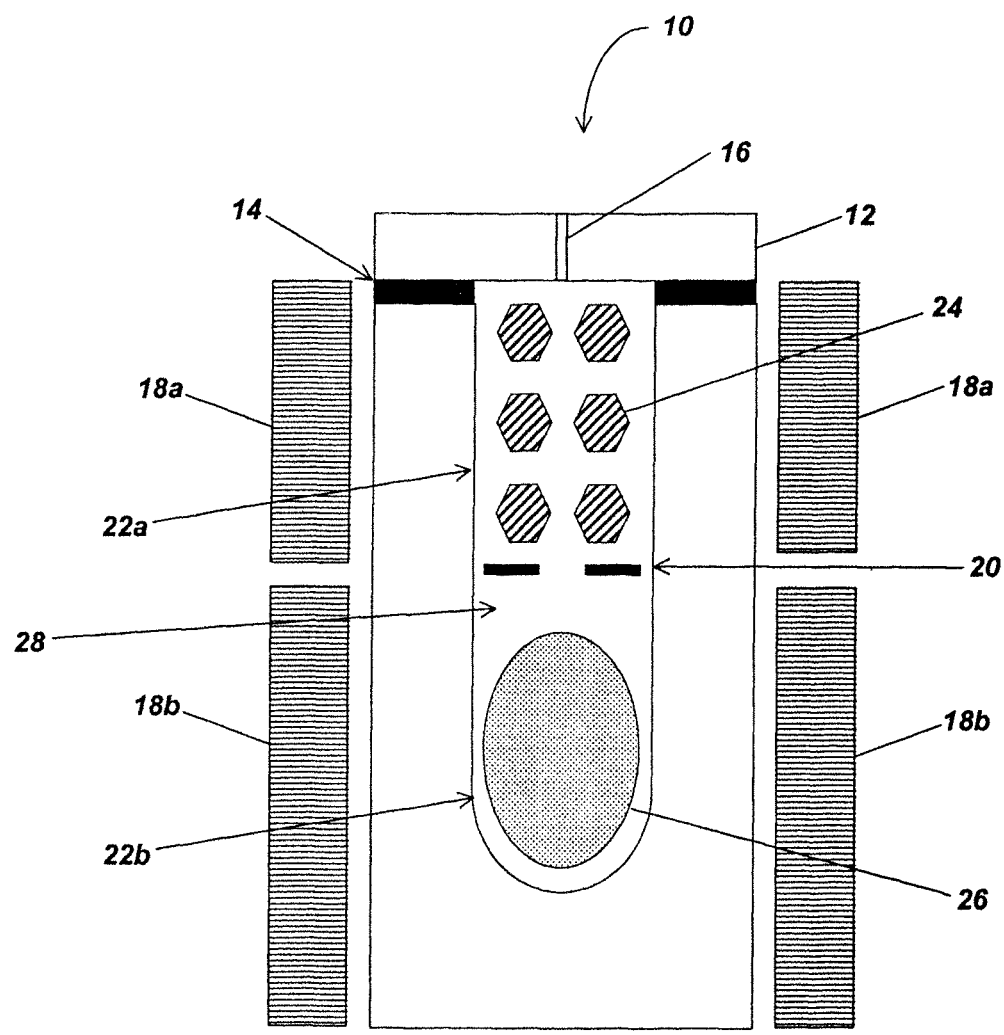
FIG. 1 is a schematic of a high-pressure vessel according to an embodiment of the present invention.

FIG. 1 is a schematic of an ammonothermal growth system comprising a high-pressure reaction vessel 10 according to one embodiment of the present invention. The vessel, which is an autoclave, may include a lid 12, gasket 14, inlet and outlet port 16, and external heaters/coolers 18a and 18b. A baffle plate 20 divides the interior of the vessel 10 into two zones 22a and 22b, wherein the zones 22a and 22b are separately heated and/or cooled by the external heaters/coolers 18a and 18b, respectively. An upper zone 22a may contain one or more group-III nitride seed crystals 24 and a lower zone 22b may contain one or more group-III containing source materials 26, although these positions may be reversed in other embodiments. Both the seed crystals 24 and source materials 26 may be contained within baskets or other containment devices, which are typically comprised of a Ni—Cr alloy. The vessel 10 and lid 12, as well as other components, may also be made of a Ni—Cr based alloy. Finally, the interior of the vessel 10 is filled with a nitrogen-containing solvent 28 to accomplish the ammonothermal growth.

In one embodiment of the present invention, a boron-containing compound 30 may also be introduced into the vessel 10. The boron-containing compound 30 is used as an "impurities getter" for binding to one or more impurities 32 present in the vessel 10. The result of this binding is an impurity compound 34 comprised of both the boron from the boron-containing compound 30 and one or more of the impurities 32. Although these elements are represented by ellipses in FIG. 1, the boron-containing compound 30, impurities 32 and impurities compound 34 may exist in any state, i.e., supercritical, gas, liquid or solid.

Process Description

Figure 2:
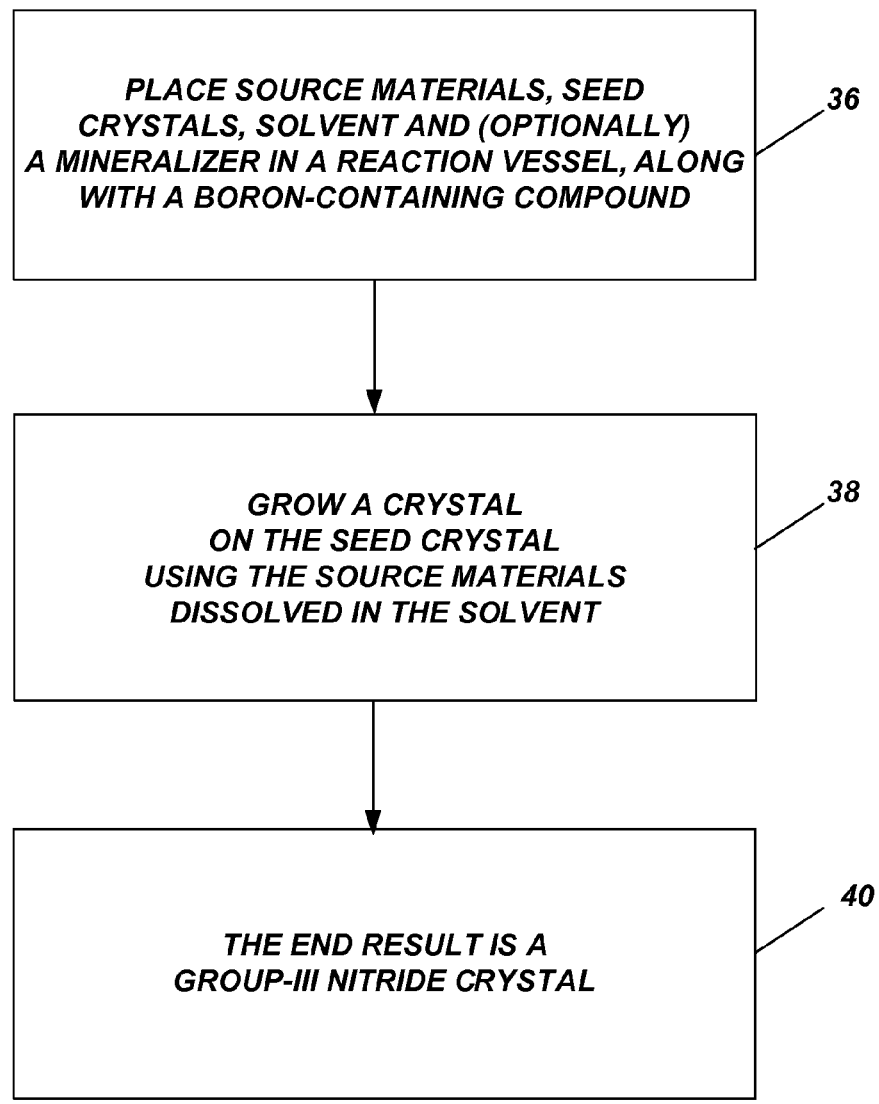
FIG. 2 is a flowchart illustrating the method according to an embodiment of the present invention.

FIG. 2 is a flow chart illustrating a method for obtaining or growing a group-III nitride-containing crystal using the apparatus of FIG. 1 according to one embodiment of the present invention.

Block 36 represents placing one or more group-III nitride seed crystals 24, one or more group-III containing source materials 26, and a nitrogen-containing solvent 28 in the vessel 10, wherein the seed crystals 24 are placed in a seed crystals zone (i.e., either 22a or 22b, namely opposite the zone 22b or 22a containing the group-III containing source materials 26), the source materials 26 are placed in a source materials zone (i.e., either 22b or 22a, namely opposite the zone 22a or 22b containing the seed crystals 24). The seed crystals 24 comprise a group-III containing crystal; the source materials 26 comprise a group-III containing compound, a group-III element in its pure elemental form, or a mixture thereof, i.e., a group-III nitride monocrystal, a group-III nitride polycrystal, a group-III nitride powder, group-III nitride granules, or other group-III containing compound; and the solvent 28 comprises supercritical ammonia or one or more of its derivatives, which may be entirely or partially in a supercritical state. An optional mineralizer may be placed in the vessel 10 as well, wherein the mineralizer increases the solubility of the source materials 26 in the solvent 28 as compared to the solvent 28 without the mineralizer.

Block 38 represents growing group-III nitride crystal on one or more surfaces of the seed crystals 24, wherein the environments and/or conditions for growth include forming a temperature gradient between the seed crystals 24 and the source materials 26 that causes a higher solubility of the source materials 26 in the solvent 28 in the source materials zone and a lower solubility, as compared to the higher solubility, of the source materials 26 in the solvent 28 in the seed crystals zone. Specifically, growing the group-III nitride crystals on one or more surfaces of the seed crystals 24 occurs by changing the source materials zone temperatures and the seed crystals zone temperatures to create a temperature gradient between the source materials zone and the seed crystals zone that produces a higher solubility of the source materials 26 in the solvent 28 in the source materials zone as compared to the seed crystals zone. For example, the source materials zone and seed crystals zone temperatures may range between 0° C. and 1000° C., and the temperature gradients may range between 0° C. and 1000° C.

Block 40 comprises the resulting product created by the process, namely, a group-III nitride crystal grown by the method described above. A group-III nitride substrate may be created from the group-III nitride crystal, and a device may be created using the group-III nitride substrate.

Use of Boron-Containing Compounds During Ammonothermal Growth

The present invention envisions using boron-containing compounds 30 (gasses, fluids or solids) within the vessel 10 of FIG. 1 during the process steps of FIG. 2 to modify the vessel's environment. Specifically, the boron-containing compounds 30 are placed into the vessel in Block 36 for use as impurity getters for binding to the impurities 32 during the ammonothermal growth of group-III nitride crystals 40 in Block 38, resulting in impurities compounds 34 that may be removed from the vessel 10 before or after Block 40. The result is that group-III nitride crystals 40 grown using the boron-containing compounds 30 have fewer impurities as compared to group-III nitride crystals 40 grown without the boron-containing compounds 30. In addition, the boron-containing compounds 30 may be used to modify or enhance the solubility of source materials 26 and the seed crystals 24 into the solvent 28.

Using Boron-Containing Compounds as Impurity Getters During the Ammonothermal Growth of Group-III Nitride Crystals During the growth of the group-III nitride crystals 40, it is imperative that the concentrations of impurities 32 within the closed vessel 10 be reduced to a minimum before and during the process steps of FIG. 2. One method to reduce impurities 32 within the vessel 10 includes lining the vessel 10 walls with high purity liner materials. While this is effective, impurities 32, such as oxygen, oxygen-containing compounds, water, or other materials in the vessel 10, may adhere to the surfaces of vessel 10 walls and material placed inside the vessel 10 (such as the seed crystals 24 and the source materials 26, along with the structural components used in different zones 22a and 22b of the vessel 10, such as baskets and the like) and incorporate into the solvent 18 once the vessel 10 is heated to elevated temperatures.

The present invention envisions using boron-containing compounds 30 as "impurities getters." The basic idea is that boron will preferentially form compounds 34 with the impurities 32, such as, but not limited to, yet most notably, oxygen, oxygen-containing compounds, water, or other materials in the vessel 10, forming, for example, boron oxide $B_2O_3$. Once this compound 34 with the impurity 32 is formed, it will remain a compound 34 throughout the period it spends within the closed vessel 10 until it is removed from the vessel 10.

The motivation behind using boron as an oxygen getter is due to the strong oxide that boron preferentially likes to form. The oxide that forms melts at 480° C. at 1 atm pressures and boils at 1680° C. at 1 atm. Under the conditions within the vessel 10, it may form a solid compound and not break apart, thereby trapping any additional oxygen or other impurities 32 in the closed vessel 10 during the process steps of FIG. 2.

A non-exclusive list of possible boron-containing compounds 30 include: borane ($BH_3$), diborane ($B_2H_6$), borazane ($BNH_6$), borazine ($B_3N_3H_6$), sodium borohydride ($NaBH_4$), and boron in its elemental form. It may further be advantageous to use a combination of various boron-containing compounds 30 at different molar ratios within the solvent 28, which may be a nitrogen-containing and/or boron-containing supercritical fluid or gas, due to varying ability of the different compounds to attract and bind different types of impurities 32.

Experimental tests need to be performed to determine the seen ability of the boron-containing compounds 30 to bond to the impurities 32 and passivate (i.e. remain bonded to it) it during growth. Once verified, scale up issues need to be addressed, the largest of them most likely being safety.

Using a Boron-Containing Gas and/or Supercritical Fluid for Enhanced Solubility of Group-III Containing Source Materials into the Solvent In order to improve on the growth rate and crystal quality of the group-III nitride crystals 40, among other things, the solubility of the source materials 26 into the solvent 28 is of great importance. Enhanced solubility of the source materials 26 into the solvent 28 may enhance growth rates and improve upon the quality of the resulting group-III nitride crystals 40 if optimized conditions are chosen between the two solubility zones 22a and 22b, and within the vessel 10 itself.

The state of the art prior to the present invention involves adding additional atoms, molecules, compounds and/or chemical complexes to the solvent 28 to enhance the solubility of the source materials 26. Examples of additional atoms, molecules, compounds and/or chemical complexes added to the solvent 28, sometimes also referred to as mineralizers, included alkali metals such as sodium, alkali metal compounds such as sodium azide, or alkaline earth metals such as magnesium.

The present invention discloses the use of a boron-containing gas or fluid, instead of, or in addition to, the nitrogen-containing solvent 28. The purpose of the boron-containing gas or fluid is to enhance the solubility of the source materials 26 and seed crystals 24 into the solvent 28. This could potentially also reduce the amount of mineralizer needed, allowing for the creation of purer group-III nitride crystals 40.

A non-exclusive list of possible boron-containing gasses and fluids used in this manner include: borane ($BH_3$), diborane ($B_2H_6$), borazane ($BNH_6$), borazine ($B_3N_3H_6$), sodium borohydride ($NaBH_4$), and boron in its elemental form. By using these and other boron-containing compounds along with additional nitrogen-containing compounds, such as hydrazine ($N_2H_4$), triazane ($N_3H_5$), tetrazane ($N_4H_6$), triazene ($N_3H_3$), diimine ($N_2H_2$), nitrogen ($N_2$), nitrene (NH), and ammonia ($NH_3$), it is possible to create a supercritical fluid or gas containing both boron and nitrogen atoms. The ratio of nitrogen to boron is freely adjustable from 0 to just under 100%. No nitrogen must be added to the fluid, yet it may be beneficial. Further, the number and variety of compounds, chemical complexes, and gases that make up the supercritical fluid or gas may be unlimited. Any number of combinations and ratios of the various boron-containing compounds and nitrogen-containing compounds may be used to obtain the desired properties for the solvent 28.

The present invention also discloses the introduction of boron-containing compounds to the solvent 28 through the use of compounds that act as mineralizers during growth and thereby additionally enhance solubility. An example of one such mineralizer that is a boron-containing compound is sodium borohydride ($NaBH_4$). This is beneficial as it has been noticed that the borohydride is an excellent ligand for metal ions, such as group-III metal ions, for example, Al, Ga, In. Therefore, the boron-containing gas or fluid may be formed not only by the addition of simple boron-containing and nitrogen-containing compounds, but may also include other elements from the periodic table of elements to enhance solubility, or modify the conditions within the vessel 10 for whatever purpose it may be necessary.

The motivation behind using a boron-containing supercritical fluid is that, among other things, the larger dipole moment, a different dielectric constant and/or the different gas phase chemistry will enhance the solubility of the source materials 26 into the solvent 28. Additionally, if the boron-containing compound, or boron as an atom, is incorporated into the group-III nitride crystals 40, it will not have as many negative effects associated with it as when compared to other mineralizers, such as lithium. Examples of these negative effects, which may lead to the deterioration of the device quality, efficiency and life time when using the ammonothermally grown group-III nitride crystals 40 as a substrate for these electronic or optoelectronic devices include, but is not limited to: discoloration of the substrate thereby unintentionally absorbing light, diffusion of the mineralizer impurities into newly grown epitaxial layers using a chemical vapor deposition technique such as metal-organic chemical vapor deposition (MOCVD) or hydride vapor phase epitaxy (HYPE), or enhanced electrical conductivity of the substrate which may lead to malfunction or reduction in efficiency of devices that require insulating or semi-insulating substrates.

Experimental tests need to be performed to determine the actual solubility of group-III containing source materials into a boron-containing gas or supercritical fluid. Once verified, scale up issues need to be addressed, the largest of them most likely being safety. Future experimental tests will follow to determine the actual solubility of group-III nitride into solution. Solubility curves will be generated at different temperatures and pressures. Additionally additional mineralizer materials, such as, but not limited to, alkali metals and alkaline earth metals, may be added to the fluid to further enhance solubility. Optimized conditions will be established with respect to temperature and pressure to provide optimal conditions for growth of group-III nitride crystals.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for growing (Al,Ga,In)N crystals, comprising:
   (a) placing (Al,Ga,In)N source materials and (Al,Ga,In)N seed crystals into a vessel;
   (b) filling the vessel with a solvent for dissolving the (Al,Ga,In)N source materials and transporting the dissolved (Al,Ga,In)N nitride source materials to the (Al,Ga,In)N seed crystals for ammonothermal growth of the (Al,Ga,In)N crystals; and
   (c) placing boron-containing material into the vessel's environment for use as impurity getters during the ammonothermal growth of the (Al,Ga,In)N crystals, wherein the boron-containing material includes one or more of borane ($BH_3$), diborane ($B_2H_6$), borazane ($BNH_6$), borazine ($B_3N_3H_6$), sodium borohydride ($NaBH_4$), and boron in its elemental form.

2. The method of claim 1, wherein the solvent comprises a nitrogen-containing solvent.

3. The method of claim 1, wherein the impurity getters remove one or more impurities that include oxygen, oxygen-containing compounds, water or other materials in the vessel.

4. The method of claim 1, wherein the boron-containing material are used to modify or enhance solubility of the (Al,Ga,In)N source materials or (Al,Ga,In)N seed crystals into the solvent.

5. The method of claim 1, wherein the solvent is entirely or partially in a supercritical state.

* * * * *